(12) United States Patent
Dauth et al.

(10) Patent No.: US 10,707,599 B2
(45) Date of Patent: Jul. 7, 2020

(54) CONTACT ASSEMBLY FOR HIGH-CURRENT APPLICATIONS

(71) Applicant: BorgWarner Inc., Auburn Hills, MI (US)

(72) Inventors: Alexander Dauth, Maulbronn (DE); Gerd Braeuchle, Hueffenhardt (DE); Ramona Grundmeier, Argenschwang (DE)

(73) Assignee: BorgWarner Inc., Auburn Hills, MI (US)

( * ) Notice: Subject to any disclaimer, the term of this patent is extended or adjusted under 35 U.S.C. 154(b) by 0 days.

(21) Appl. No.: 16/282,755

(22) Filed: Feb. 22, 2019

(65) Prior Publication Data

US 2019/0267731 A1   Aug. 29, 2019

(30) Foreign Application Priority Data

Feb. 23, 2018   (EP) ..................... 18158374

(51) Int. Cl.
  *H01R 12/70*   (2011.01)
  *H01R 12/57*   (2011.01)
  (Continued)

(52) U.S. Cl.
  CPC ............. *H01R 12/57* (2013.01); *F02B 39/10* (2013.01); *H01R 12/58* (2013.01); *H01R 12/718* (2013.01);
  (Continued)

(58) Field of Classification Search
  CPC combination set(s) only.
  See application file for complete search history.

(56) References Cited

U.S. PATENT DOCUMENTS

| 4,181,387 | A | * | 1/1980 | Walters | .................. | H01R 12/58 29/838 |
| 5,362,244 | A | * | 11/1994 | Hanson | .................. | H01R 12/58 439/82 |

(Continued)

FOREIGN PATENT DOCUMENTS

| EP | 0840400 A2 | 5/1998 |
| EP | 2187480 A2 | 5/2010 |

OTHER PUBLICATIONS

Machine-Assisted English translation for EP 2187480 A2 extracted from the espacenet.com database on Dec. 20, 2019 14 pages.

*Primary Examiner* — Xuong M Chung Trans
(74) *Attorney, Agent, or Firm* — Howard & Howard Attorneys PLLC

(57) ABSTRACT

Contact assembly for high-current applications, comprising an electric circuit board (3); a non-flexible conductor rod (1) protruding in a longitudinal direction, the conductor rod (1) transmitting an electric current of more than 30 Ampere, in particular more than 50 Ampere, between the circuit board (3) and an electric device; and a receiving member (2), the receiving member (2) being fixed to the circuit board (3); wherein the receiving member (2) holds the conductor rod (1) and transmits the current between the conductor rod (1) and the circuit board (3); wherein the receiving member (2) comprises a plurality of elastically deformable tongues (5), the tongues (5) being arranged circumferentially about the conductor rod (1) and providing for a mechanical support as well as an electric contact between the conductor rod (1) and the receiving member (2).

18 Claims, 2 Drawing Sheets

(51) Int. Cl.
*F02B 39/10* (2006.01)
*H01R 12/58* (2011.01)
*H01R 13/03* (2006.01)
*H01R 13/11* (2006.01)
*H05K 1/18* (2006.01)
*H01R 12/71* (2011.01)

(52) U.S. Cl.
CPC ........... *H01R 13/03* (2013.01); *H01R 13/111* (2013.01); *H05K 1/181* (2013.01); *H01R 2201/10* (2013.01); *H05K 2201/1031* (2013.01); *H05K 2201/10325* (2013.01)

(56) References Cited

U.S. PATENT DOCUMENTS

| | | | |
|---|---|---|---|
| 5,404,860 A * | 4/1995 | Morino | F02P 3/005 123/605 |
| 6,700,464 B2 | 3/2004 | Ling et al. | |
| 8,480,412 B2 * | 7/2013 | Belanger, Jr. | H01R 12/7064 439/751 |
| 2001/0051105 A1 * | 12/2001 | Miyoshi | C22C 9/00 420/477 |
| 2011/0223056 A1 * | 9/2011 | Aruga | C22C 9/02 420/471 |

* cited by examiner

CONTACT ASSEMBLY FOR HIGH-CURRENT APPLICATIONS

CROSS-REFERENCE TO RELATED APPLICATIONS

This application claims the benefit of European Patent Application No. 18158374.1 filed Feb. 23, 2018, the disclosure of which is herein incorporated by reference in its entirety.15.

FIELD OF THE INVENTION

The invention relates to a contact assembly for high-current applications according to the preamble of claim 1. The invention further relates to a charger for a combustion engine according to claim 15.

TECHNICAL BACKGROUND

U.S. Pat. No. 6,700,464 B2 describes a contact for connecting a coaxial cable to a circuit board. Such devices are not suitable for high current applications.

In the field of electrically driven turbo-chargers for combustion engines it is known to use a type of contact provided by Würth Elektronik GmbH. These contacts comprise a solid square block with a plurality of legs protruding from the block, the legs being press-fitted to a circuit board. A conductor rod for transferring electric current to an electric motor is fixedly received in an opening of the square block.

It is the object of the invention to provide for a contact assembly for high current applications which allows for a low cost, but reliable connection between a circuit board and a conductor rod.

SUMMARY

For a contact assembly as referred to in the beginning, this object is achieved according to the invention by the features of the characterizing part of claim 1.

By means of holding and electrically contacting the contact rod with a plurality of elastically deformable tongues, a well-defined contact of sufficient total contact area is established.

A high current application in the sense of the present invention is meant to have currents of more than 30 A, preferably more than 50 A, flowing through the receiving member and via the tongues into the conductor rod in a typical mode of operation. In particular, the contact assembly is designed to allow for such high currents flowing during a permanent operation of at least several hours.

The high currents are preferably operated under a potential difference of more than 10 Volt, most preferably more than 30 Volt. Typical applications are in the field of modern vehicles, including combustion driven, electrically driven or hybrid driven. Such vehicles employ electric power nets based on higher voltages than the standard 12 V nets. One preferred application of a contact assembly of the invention is combined with a 48 V vehicle power net.

The power transmitted from the circuit board to the electrical device via the contact assembly is preferably more than 300 Watt continuous power, more preferably more than 1 kW continuous power, and most preferred more than 3 kW continuous power.

Generally preferred, the receiving member is designed as one piece. In particular, the receiving member is lacking any intermediate two-piece design or surface contact between the fixation of the receiving member to the circuit board and the electric contact of the tongues to the conductor rod.

In order to distribute the holding force and contact area evenly about the conductor rod, the number of elastically deformable tongues is preferably at least three, more preferably at least six.

In a generally advantageous embodiment of the invention, the receiving member is connected to a conducting path of the circuit board by means of soldering, preferably in the form of a surface-mounted device (SMD). In particular, the given standards for SMD-based circuit boards can be met. As a further benefit, the receiving member can be applied to the circuit board by automated manufacturing.

In order to achieve a particular low cost production of the receiving member, the receiving member can be formed as a sheet metal part, preferably a thickness of the sheet metal being less than 1 mm, more preferably less than 0.6 mm. The original sheet metal can be further processed to the receiving member by any known means like cutting, punching, bending, coating, thermal annealing and the like.

In case of a preferred embodiment of the invention, the receiving member comprises a base ring bent circumferentially about the longitudinal direction of the conductor rod, the plurality of tongues protruding from one side of the base ring, and a plurality of contact tabs protruding preferably from an opposite side of the base ring, the contact tabs being fixedly connected to the circuit board. Such design provides for a simple solution in manufacturing the receiving member e.g. from a sheet of metal. If the contact tabs are facing the opposite direction than the tongues with respect to the base ring, a larger number of tongues and contact pads can be provided.

In order to provide for an efficient transfer of the high current, preferably the conductor rod has a basically constant cross section, the cross section having an electrically conductive size of more than 8 mm$^2$, in particular of more than 18 mm$^2$. Most preferred, the cross section is of circular shape. A typically preferred conductor rod would be a solid cylinder with a diameter according to the demands for high current. In the case of a conductive cross section of 18 mm$^2$, a cylindrical conductor rod would have a diameter of about 4.8 mm (or 3.2 mm diameter for 8 mm$^2$ cross section). A bigger diameter further allows for a better contact by the receiving member due to a higher number of tongues and/or a greater contact area per tongue.

As a general aim, a resistance between the circuit board and the conductor rod, caused by the receiving member, is less than 0.001 Ohm, more preferred less than 0.0005 Ohm.

In order to allow for tolerances at assembling and during operation, e.g. for thermal expansion, it is preferably provided that the conductor rod can continuously move along the longitudinal direction about an interval of tolerance while being held and being contacted by the elastically loaded tongues. For this purpose, the contact rod has preferably a prismatic form (or constant cross-sectional shape) in the region of the contact of the tongues. In other embodiments, the conductor rod could as well have a special form like a support groove for the tongues in order to enhance a contact area.

In order to ascertain sufficient mechanical support as well as a reliable electrical contact, each of the elastically loaded tongues can comprise a first end which is positioned at a distance from the conductor rod, and a second end, which abuts against the conductor rod. Generally preferred, the tongues are spring loaded and/or elastically pressed against the circumferential surface of the conductor rod with a force of more than 1 Newton for each tongue.

In alternative embodiments, the second end of the tongues could as well be connected by a second base ring. In such embodiments, the tongues would be bent in a curved manner so that intermediate sections of the tongues being in a spring-loaded contact with the conductor rod, a minimum inner diameter of the receiving member being located about half way between the two base rings.

In case of a specifically preferred embodiment of the invention, the circuit board comprises an opening, the receiving member being arranged at the opening, and the conductor rod projecting through the opening. Even more preferred, the tongues hold the conductor rod on a first side of the circuit board, the receiving member being fixed to the circuit board on an opposite side. Altogether, these features provide for a reduced height of the assembly.

In order to provide for an optimized electrical contact which is less susceptible to oxidation, at least the tongues, or the conductor rod, most preferred both the tongues and the conductor rod, have at least a surface consisting of silver. The silver can be coated onto the conductor rod and/or receiving member by any suitable manner known in the art.

For minimization of a power loss and/or local heating, at least a core of the receiving member is preferably made from a copper based alloy, more preferably having a conductivity of at least 70% of IACS (International Annealed Copper Standard).

With respect to a long lifetime and safe mechanical and electrical contact even after a high number of operating hours, the alloy is optimized for thermal stress relaxation, wherein a remaining stress of more than 80%, in particular more than 85%, is achieved at a Larson-Miller-parameter of 9.0. The Larson-Miller-Parameter is defined as $P=(20+\log(t))*T+273)*0.001$; with t Time in hours, T temperature in ° C. For example P=9 is equivalent to a relaxation time (operating time) of 1000 h at 118° C.

Generally preferred, the electric device is an electric motor, in particular for driving a charger for a combustion engine. Such application has high demands on thermal and vibrational stability.

The object of the invention is further achieved by a charger for a combustion engine, comprising a compression device driven by an electric motor, wherein the electric motor is connected to a power supply by means of a contact assembly according to the invention. The charger can in particular be a turbo-charger. In recent years, the application of electrically driven turbo-chargers, in particular for combustion engines of cars and other vehicles, has become increasingly important. The contact assembly of the invention is specifically optimized for this application in terms of power transmission as well as thermal and mechanical exposure.

Further advantages and features of the invention are described in the embodiment of the invention described below as well as in the dependent claims.

A preferred embodiment of the invention is described hereinafter and is further explained by means of the enclosed drawings.

SHORT DESCRIPTION OF THE DRAWINGS

DETAILED DESCRIPTION

Figure 1:
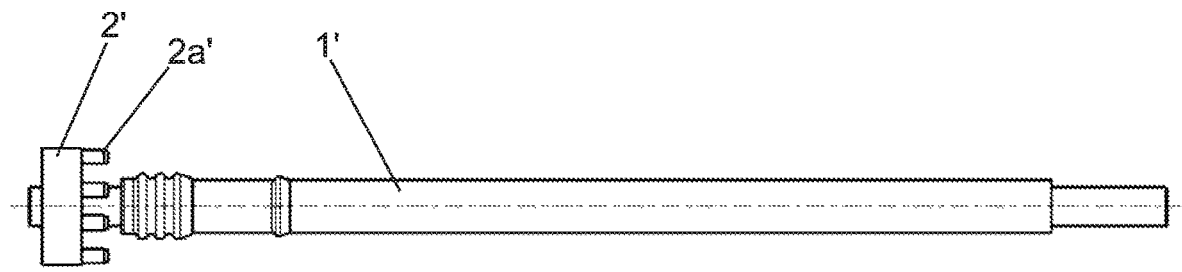
FIG. 1 shows a top view of a contact assembly of the prior art.

The prior art device as in FIG. 1 shows a conductor rod 1' which is fixedly received in an opening of a solid square block 2' with a plurality of legs 2a' protruding from the block. The legs 2a' are designed to be press-fitted to a circuit board (not shown), providing for mechanical and electrical contact by means of the press-fit.

Figure 2:
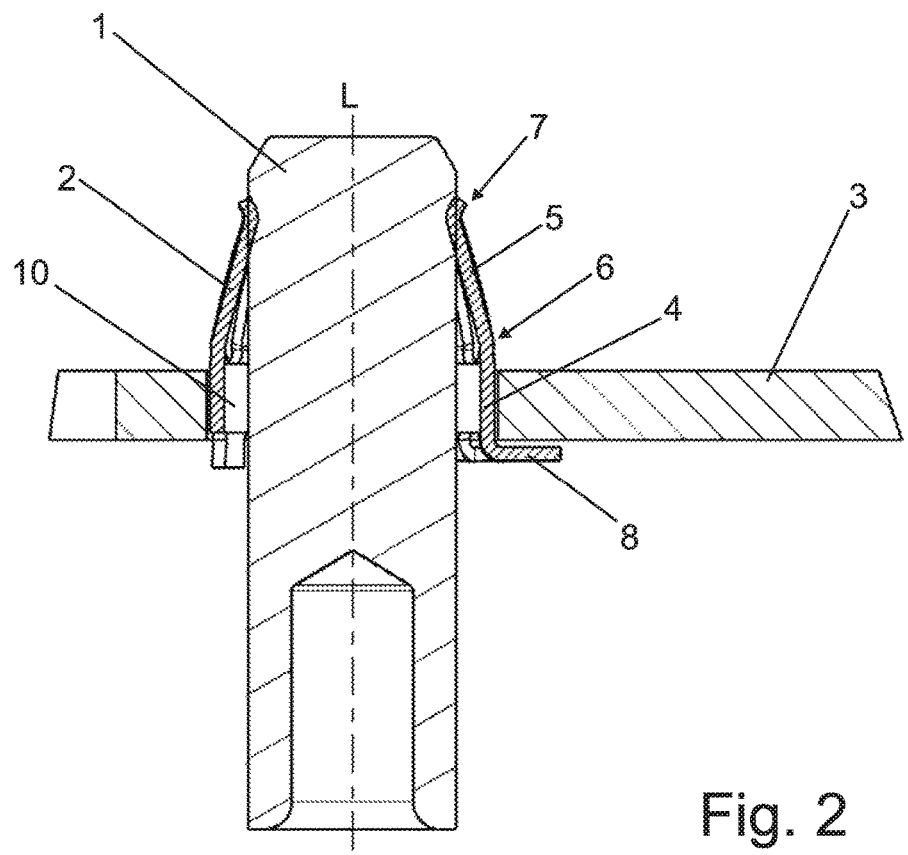
FIG. 2 shows a sectional view of a contact assembly according to the invention.

FIG. 2 shows a contact assembly according to the invention, comprising a conductor rod 1, a receiving member 2 and a circuit board 3.

The conductor rod 1 has at least and end portion of a prismatic shape, in the present case the shape of a solid cylinder. The conductor rod, or at least its end portion, protrudes in a longitudinal direction L. The cross section of the conductor rod 1 is hence a solid circle. In an example, the diameter of the conductor rod is 6 mm, accordingly the size of the electrically conductive cross section being about 28 $mm^2$.

Figure 3:
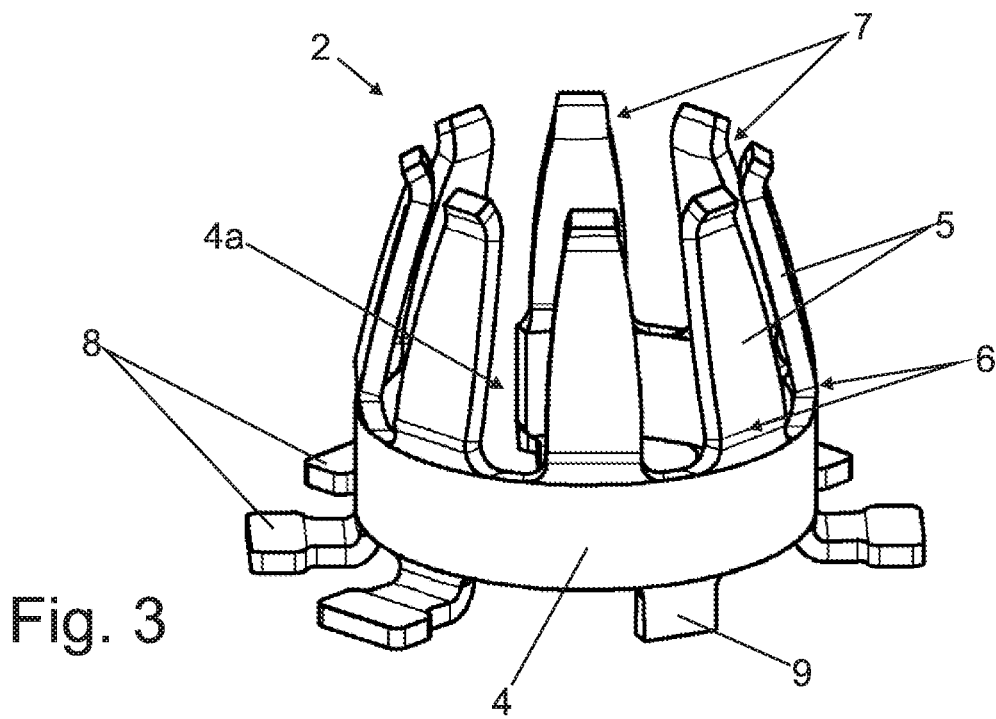
FIG. 3 shows a spatial view of a receiving member of the assembly of FIG. 2.
Figure 4:
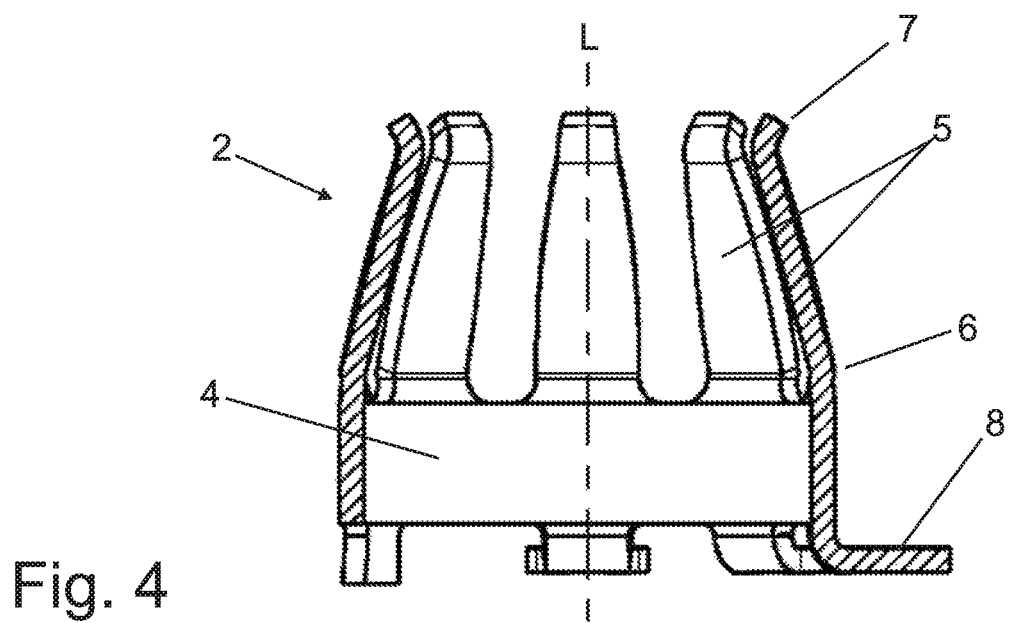
FIG. 4 shows the receiving member of FIG. 2 in a sectional view.

The receiving member 2 has the form of a tulip or basket (see FIGS. 3 and 4), comprising a base ring 4 which has an inner diameter that is greater than an outer diameter of the conductor rod 1.

A plurality of altogether 8 tongues 5 is arranged equally spaced along the base ring 4. The tongues 5 originate with a first end 6 from the base ring 4, due to the diameter of the base ring the first ends 6 being positioned at a radial distance to the conductor rod 1. The tongues 5 are bent inclined with respect to a central axis of the receiving member 2, such that cranked second ends 7 of the tongues 5 abut against a side wall of the conductor rod 1. Due to the inclined bending with respect to the central axis L, the tongues 5 are mechanically pre-loaded whilst abutting against the conductor rod 1. Each of the tongues 5 presses against the conductor rod 1 with an elastic force of at least 1 Newton, for example about 2 Newton.

Whilst being held by the tongues 5, the conductor rod 1 can still be moved in its longitudinal direction L at least about an interval of tolerance.

On the other, opposite side of the base ring 4, a plurality of contact tabs 8 protrude and are bent at an angle of 90°, so that soldering surfaces of the contact tabs 8 are abutted against a conducting path of the circuit board. The contact tabs 8 are soldered to the conducting path in a way of surface mounting, connecting the receiving member 2 to the circuit board as a surface mounted device (SMD).

In order to enhance the assembly process of the receiving member 2, an auxiliary tab 9 protrudes from the base ring and interacts with a corresponding recess in the circuit board 3, providing for a defined position and orientation of the pre-assembled receiving member 2 before a step of soldering is finished.

The receiving member 2 is formed as a one-piece item. For example, it can be formed as a single sheet metal part, wherein the material of the sheet metal has a thickness of 0.4 mm and is chosen to be a copper based alloy with small additions of 0.5% Cr, 0.2% Ag, 0.06% Ti and 0.03% Si. This alloy has a conductivity of 79% of IACS. Its thermal relaxation is optimized and shows a residual stress of about 90% in case of a Larson-Miller parameter of 9.0. As the receiving member 2 is bent from a sheet metal part about a central axis L, the base ring 4 is not closed, but left with a gap 4a (see FIG. 3).

In order to enhance the electrical contact and get a better protection for oxidization, the receiving member 2 and the conductor rod 1 can be surface-coated with silver.

The receiving member 2 is mounted to the circuit board 3 in the way that it is arranged at an opening 10 of the circuit board 3. The base ring 4 is positioned mostly within the opening 10, with the tongues 5 protruding on one side of the circuit board and the contact tabs 8 being soldered to the opposite side of the circuit board. By this arrangement, a total height of the contact assembly is reduced. The conductor rod 1 projects through the opening 10 of the circuit board 3, wherein an end of the conductor rod 1 on the side of the circuit board 3 is close to the second ends 7 of the tongues 5.

The opposite end of the conductor rod is connected with an electrical device (not shown) which is supplied with electrical power by the conductor rod 1. The longitudinal direction L of the conductor rod 1 is at least roughly arranged perpendicular to a plane of the circuit board 3.

In the present case, the electrical device is a motor of an electrically driven turbo-charger of a combustion engine. The electrical current transferred from the circuit board 3 via the receiving member 2 and through the conductor rod 1 to the electrical motor is about 100 A at 48 V in a typical mode of permanent operation. Hence a power of nearly 5 kW is transmitted by the above described contact assembly.

REFERENCE LIST

1' conductor rod (prior art)
2' square block (prior art)
2a' legs of square block (prior art)
1 conductor rod
2 receiving member
3 circuit board
4 base ring
4a gap of base ring 4
5 tongue
6 first end of tongue
7 second end of tongue
8 contact tab
9 auxiliary tab
10 opening in circuit board
L longitudinal direction of conductor rod, central axis of receiving member

The invention claimed is:

1. Contact assembly for high-current applications, comprising:
an electric circuit board (3);
a non-flexible conductor rod (1) protruding in a longitudinal direction, the conductor rod (1) transmitting an electric current of more than 30 Ampere between the circuit board (3) and an electric device; and
a receiving member (2), the receiving member (2) being fixed to the circuit board (3);
wherein the receiving member (2) holds the conductor rod (1) and transmits the current between the conductor rod (1) and the circuit board (3);
characterized in that,
the receiving member (2) comprises a plurality of elastically deformable tongues (5), the tongues (5) being arranged circumferentially about the conductor rod (1) and providing for a mechanical support as well as an electric contact between the conductor rod (1) and the receiving member (2),
wherein the receiving member (2) comprises a base ring (4) bent circumferentially about the longitudinal direction (L) of the conductor rod (1), the plurality of elastically deformable tongues (5) protruding from one side of the base ring (4), each of the elastically loaded tongues (5) comprises a first end (6) which is positioned at a radial distance from the conductor rod (1), and a plurality of contact tabs (8) protruding from an opposite side of the base ring (4), the contact tabs (8) being fixedly connected to the circuit board (2), and each of the elastically loaded tongues (5) bent inclined with respect to a central axis of the receiving member (2).

2. Contact assembly as claimed in claim 1, characterized in that the receiving member (2) is designed as one piece.

3. Contact assembly as claimed in claim 1, characterized in that the receiving member (2) is connected to a conducting path of the circuit board (3) by means of soldering.

4. Contact assembly as claimed in claim 1, characterized in that the receiving member (2) is formed as a sheet metal part.

5. Contact assembly as claimed in claim 1, characterized in that the conductor rod (1) has a basically constant cross section, the cross section having an electrically conductive size of more than 8 mm$^2$.

6. Contact assembly as claimed in claim 1, characterized in that the conductor rod (1) can continuously move along the longitudinal direction (L) about an interval of tolerance while being held and being contacted by the elastically loaded tongues (5).

7. Contact assembly as claimed in claim 1, characterized in that each of the elastically loaded tongues (5) comprises a second end (7), which abuts against the conductor rod (1).

8. Contact assembly as claimed in claim 1, characterized in that the circuit board (3) comprises an opening (10), the receiving member (2) being arranged at the opening (10), and the conductor rod (1) projecting through the opening (10).

9. Contact assembly as claimed in claim 8, characterized in that the tongues (5) hold the conductor rod (1) on a first side of the circuit board (3), the receiving member (2) being fixed to the circuit board (3) on an opposite side.

10. Contact assembly as claimed in claim 1, characterized in that at least the tongues (5), or the conductor rod (1), in particular both the tongues (5) and the conductor rod (1), have at least a surface consisting of silver.

11. Contact assembly as claimed in claim 1, characterized in that at least a core of the receiving member (2) is made from a copper based alloy having a conductivity of at least 70% of IACS (International Annealed Copper Standard).

12. Contact assembly as claimed in claim 11, characterized in that the alloy is optimized for thermal stress relaxation, wherein a remaining stress of more than 80% is achieved at a Larson-Miller-parameter of 9.0.

13. Contact assembly as claimed in claim 1, characterized in that the electric device is an electric motor for driving a charger for a combustion engine.

14. Charger for a combustion engine, comprising a compression device driven by an electric motor, characterized in that the electric motor is connected to a power supply by means of a contact assembly according to claim 1.

15. Contact assembly as claimed in claim 1, wherein the electric current is more than 50 Ampere.

16. Contact assembly as claimed in claim 3, characterized in that the receiving member (2) is connected to the conducting path of the circuit board (3) by means of soldering in the form of a surface-mounted device (SMD).

17. Contact assembly as claimed in claim 4, wherein sheet metal of the sheet metal part has a thickness less than 1 mm.

18. Contact assembly as claimed in claim 5, characterized in that the conductor rod (1) has a circular shape cross section or, the cross section has an electrically conductive size of more than 18 mm².

* * * * *